(12) United States Patent
O'Meara et al.

(10) Patent No.: US 10,770,294 B2
(45) Date of Patent: Sep. 8, 2020

(54) SELECTIVE ATOMIC LAYER DEPOSITION (ALD) OF PROTECTIVE CAPS TO ENHANCE EXTREME ULTRA-VIOLET (EUV) ETCH RESISTANCE

(71) Applicant: Tokyo Electron Limited, Tokyo (JP)

(72) Inventors: David O'Meara, Albany, NY (US); Lior Huli, Albany, NY (US); Soo Doo Chae, Albany, NY (US); Wan Jae Park, Albany, NY (US)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/447,565

(22) Filed: Jun. 20, 2019

(65) Prior Publication Data

US 2019/0393035 A1 Dec. 26, 2019

Related U.S. Application Data

(60) Provisional application No. 62/741,415, filed on Oct. 4, 2018, provisional application No. 62/688,960, filed on Jun. 22, 2018.

(51) Int. Cl.
*H01L 21/033* (2006.01)
*H01L 21/02* (2006.01)
*H01L 21/311* (2006.01)

(52) U.S. Cl.
CPC ...... *H01L 21/0337* (2013.01); *H01L 21/0228* (2013.01); *H01L 21/02164* (2013.01); *H01L 21/02178* (2013.01); *H01L 21/02186* (2013.01); *H01L 21/02205* (2013.01); *H01L 21/0332* (2013.01); *H01L 21/31144* (2013.01)

(58) Field of Classification Search
CPC .......... H01L 21/0337; H01L 21/02178; H01L 21/02205; H01L 21/02186; H01L 21/02164; H01L 21/31144; H01L 21/0332; H01L 21/0228; C23C 16/00
See application file for complete search history.

(56) References Cited

U.S. PATENT DOCUMENTS

2007/0111373 A1* 5/2007 Ueda ............... H01L 21/0332
  438/105
2015/0104574 A1* 4/2015 Lee ............... C23C 16/402
  427/255.28
2017/0186614 A1* 6/2017 Ko ............... H01L 21/02186

* cited by examiner

*Primary Examiner* — Duy Vu N Deo
(74) *Attorney, Agent, or Firm* — Rothwell, Figg, Ernst & Manbeck, P.C.

(57) ABSTRACT

Methods are disclosed that selectively deposit a protective material on the top regions of patterned photoresist layers, such patterned EUV photoresist layers, to provide a protective cap that reduces erosion damage during etch processes used for pattern transfer. Some deposition of the protective material on the sidewalls of the patterned photoresist layer is acceptable, and any deposition of the protective material on the underlying layer below the patterned photoresist layer is preferably thinner than the deposition at the top of the photoresist pattern. Further, the selective deposition of protective caps can be implemented, for example, through the application of high-rotation speeds to spatial atomic layer deposition (ALD) techniques. The selective deposition of protective caps increases the flexibility of options to improve etch resistance for various processes/materials.

21 Claims, 6 Drawing Sheets

— 1 —

SELECTIVE ATOMIC LAYER DEPOSITION (ALD) OF PROTECTIVE CAPS TO ENHANCE EXTREME ULTRA-VIOLET (EUV) ETCH RESISTANCE

RELATED APPLICATIONS

This application claims priority to the following co-pending provisional application: U.S. Provisional Patent Application Ser. No. 62/688,960, filed Jun. 22, 2018, and entitled "SELECTIVE ALD CAP TO ENHANCE EUV ETCH RESISTANCE," and U.S. Provisional Patent Application Ser. No. 62/741,415, filed Oct. 4, 2018, and entitled "SELECTIVE ATOMIC LAYER DEPOSITION (ALD) OF PROTECTIVE CAPS TO ENHANCE EXTREME ULTRA-VIOLET (EUV) ETCH RESISTANCE," which are hereby incorporated by reference in their entirety.

BACKGROUND

The present disclosure relates to methods for the manufacture of microelectronic workpieces, and in particular, methods to etch material layers on microelectronic workpieces.

Device formation within microelectronic workpieces typically involves a series of manufacturing techniques related to the formation, patterning, and removal of a number of layers of material on a substrate. To meet the physical and electrical specifications of current and next generation semiconductor devices, processing flows are being requested to reduce feature size while maintaining structure integrity for various patterning processes.

Extreme ultra-violet (EUV) techniques have been used for photolithography processes to achieve reduced feature size in the manufacture of microelectronic workpieces. Because EUV photoresist patterns have very small dimensions, patterned photoresist (PR) is often unable to maintain its pattern during subsequent etch processes. Further, increases in aspect ratios for patterned structures from further scaling and greater density promotes the onset of pattern collapse. Prior solutions have tried to reduce the risk of pattern collapse by changing the photoresist hardness through composition or molecular configuration (bonding) changes. However, pattern collapse has still occurred with these prior solutions.

FIG. 1A (Prior Art) is a cross-section diagram of an example embodiment 100 where a patterned photoresist layer 102 has been formed over an underlying layer 104. The underlying layer 104 is formed over a substrate 106 for a microelectronic workpiece, and the substrate 106 can include one or more previously formed layers or structures. The underlying layer 104 represents a material layer to which the pattern from the patterned photoresist layer 102 is to be transferred. For example, the underlying layer 104 can be an oxide ($SiO_2$) layer, a nitride ($SiN_3$) layer, a hard mask layer, and/or other material layer to which the pattern is to be transferred. The patterned photoresist layer 102 can be, for example, an EUV photoresist material.

FIG. 1B (Prior Art) is a cross-section diagram of an example embodiment 150 after an etch process has been performed to transfer the pattern from the patterned photoresist layer 102 to the underlying layer 104. During this pattern transfer process, however, the photoresist layer 102 suffers erosion as indicated by brackets 152 effectively damaging and breaking down the pattern. In particular, current materials used as EUV photolithographic materials do not hold up well to etch processes (e.g., plasma etch processes) used to transfer patterns during the fabrication of microelectronic workpieces (e.g., semiconductor wafers). This erosion of the EUV photoresist pattern is often severe enough to create defects in resulting electronic devices including patterning defects such as broken pattern features, miss-shaped features, and/or other pattern anomalies that can degrade performance of the intended pattern.

SUMMARY

Embodiments are described herein for selective atomic layer deposition (ALD) of protective caps to enhance EUV processes for the manufacture of microelectronic workpieces. The disclosed methods and related systems use these selective ALD caps to make photoresists, such as EUV photoresists, more resistant to etch erosion without changing the patterning dimensions. Different or additional features, variations, and embodiments can also be implemented, and related systems and methods can be utilized as well.

For one embodiment, a method of processing microelectronic workpieces is disclosed including depositing a protective material on a patterned extreme ultraviolet (EUV) photoresist layer using selective atomic layer deposition (ALD) to form protective caps on top regions for the patterned EUV photoresist layer and transferring a pattern for the patterned EUV photoresist layer to one or more underlying layers using one or more etch processes.

In additional embodiments, the protective caps allow a target level of erosion to be achieved for the patterned EUV photoresist layer during the transferring. In further embodiments, an erosion of 2 percent or less of the height of the patterned EUV photoresist layer above an underlying layer is achieved.

In additional embodiments, the method also includes forming an EUV photoresist layer over the one or more underlying layers and patterning the EUV photoresist layer to form the patterned EUV photoresist layer. In further embodiments, the patterning includes depositing an EUV material, exposing a first portion of the EUV material to EUV radiation, and removing a second portion of the EUV material not exposed to the EUV radiation to form the patterned EUV photoresist layer.

In additional embodiments, the method also includes removing the protective caps and the patterned EUV photoresist layer. In further embodiments, the protective material includes at least one of aluminum oxide ($Al_2O_3$), silicon oxide ($SiO_2$), or titanium oxide ($TiO_2$). In further embodiments, the patterned photoresist layer includes an argon fluoride (ArF) photoresist. In still further embodiments, the depositing forms protective caps without covering exposed regions of an underlying layer.

In additional embodiments, the depositing includes positioning the microelectronic workpiece in an ALD processing tool and rotating the microelectronic workpiece through a plurality of processing regions within the ALD processing tool to deposit the protective material. In further embodiments, the protective material includes at least one of aluminum oxide ($Al_2O_3$), silicon oxide ($SiO_2$), or titanium oxide ($TiO_2$). In still further embodiments, the depositing of the protective material forms a coating of 1 to 10 nanometers.

In additional embodiments, the method also includes rotating the microelectronic workpiece through a precursor adsorption region, a separation region of nitrogen $N_2$ flow, and an oxidation and plasma treatment region to complete each layer of deposition. In further embodiments, the method includes also rotating the microelectronic workpiece through a final separation region of $N_2$ flow for each layer of deposition.

In additional embodiments, the protective material is aluminum oxide ($Al_2O_3$), and TMA (trimethyl aluminum) is used for the precursor absorption region for the ALD processing tool. In further embodiments, a supply for the TMA is reduced in the precursor absorption region to facilitate selective deposition of the protective material to the top regions of the patterned EUV photoresist layer.

In additional embodiments, the rotating occurs at a rate sufficient to the selectively deposit the protective material on the top regions of the patterned EUV photoresist layer. In further embodiments, the rotating occurs at a rotations-per-minute (rpm) of 200 rpm or greater. In further embodiments, the protective material is 20-40% thicker at the top regions of the patterned EUV photoresist layer as compared to other regions where the protective material is deposited. In still further embodiments, the top regions include up to thirty percent of the height that the patterned EUV photoresist layer extends above an underlying layer immediately below the patterned EUV photoresist layer.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

DETAILED DESCRIPTION

Figure 1A:
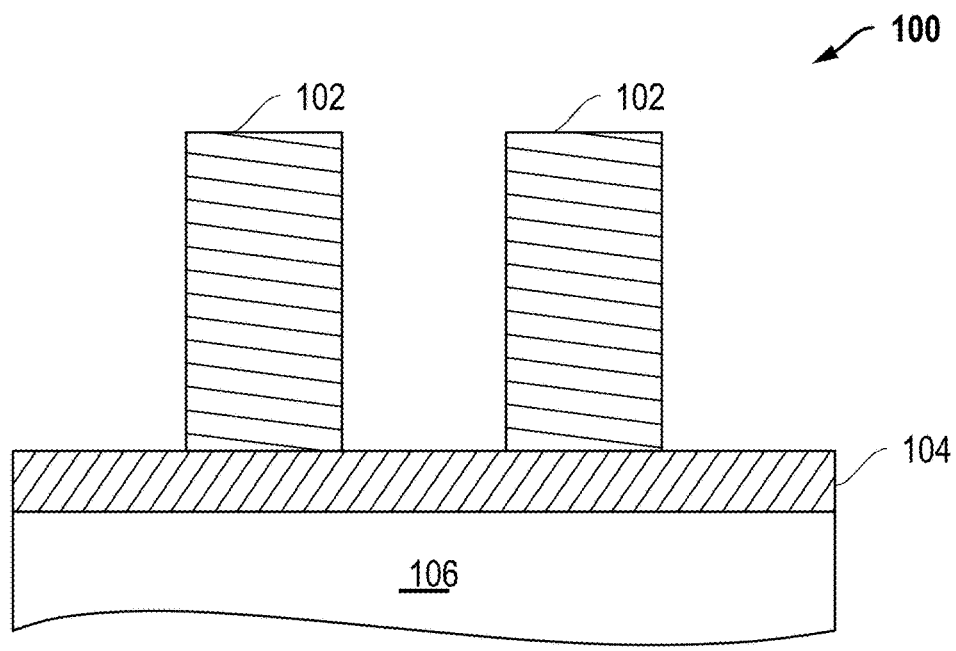
FIG. 1A (Prior Art) is a cross-section diagram of an example embodiment where a patterned photoresist layer has been formed over an underlying layer.

As described herein, an ALD thin film can be selectively deposited on the top of photoresist patterns, such as patterned EUV photoresist layers, to provide a protective cap against etch damage during pattern transfer. Some deposition of the protective material on the sidewalls of the photoresist pattern is acceptable, and any deposition on exposed regions of an underlying layer below the patterned photoresist layer is preferably thinner than the deposition at the top of the photoresist pattern. No deposition of the protective material on the exposed regions of the underlying layer is considered optimal, although is not a requirement for the disclosed embodiments. Protecting patterned photoresist layers from etch damage as described herein provides more photoresist options. Further, the selective deposition increases the flexibility of options to improve etch resistance for various processes/materials. It is further noted that the selective deposition of protective caps on photoresist structures can be implemented, for example, through the application of high-rotation speeds to spatial ALD techniques as described herein. Other advantages and implementations can also be achieved while still taking advantage of the process techniques described herein.

EUV lithography is one of the candidates for enabling next generation devices by cost friendly processes to achieve sub-22 nanometer (nm) half-pitch dimensions and below. For such sub-22 nm processes, two critical problems that have become difficult to control are photoresist erosion and pattern collapse. Photoresist erosion degrades the ability to transfer the resist feature patterns by etch processes to underlying layers due to decreases in resist thickness. Pattern collapse is promoted by the increase of aspect ratio that comes from further scaling down of feature sizes in next generation devices. Aspect ratio is a term used to describe the dimensions of resist critical dimension (CD) width to the resist height and expressing it in ratio form. One technique to overcome the pattern collapse is to reduce the resist thickness to achieve lower aspect ratios. The reduction of the resist thickness to achieve lower aspect ratios, however, also reduces the ability to fully transfer resist patterns by etch processes to underlying layers, particularly where erosion to the photoresist occurs during pattern transfer etch processes.

The embodiments disclosed herein enable low aspect ratio resist with sufficient etch transfer during etch processes by protecting patterned photoresist layers through selective atomic layer deposition (ALD) of protective caps to enhance EUV processes for the manufacture of microelectronic workpieces. The disclosed embodiments in part provide for the selective deposition of a protective cap material onto the top region of a patterned photoresist layer as protective caps to preserve the pattern during etch transfer of the pattern to the underlying layers. The material for the protective caps can be aluminum oxide ($Al_2O_3$), silicon oxide ($SiO_2$), titanium oxide ($TiO_2$), and/or other suitable protective cap material that provides a compatible deposition material. The disclosed techniques are particular useful to protect patterned EUV photoresist layers, such as patterned argon fluoride (ArF) photoresist layers, and/or other patterned photoresist layers.

It is noted that the selective deposition is preferably used to deposit the protective material to caps only on the top regions of the patterned layers, and not on the sidewalls or bottom substrate regions. However, where deposition does occur on the sidewalls or bottom substrate regions, the deposition is preferably thicker at the top of the patterned layer and thinner on the sidewall or bottom substrate. For example, the protective material deposited on the patterned photoresist layer is preferably 20 to 40 percent thicker at the top regions of patterned photoresist layers. It is also noted that the top regions for the patterned photoresist layer represents the top five to thirty percent of the height that the patterned photoresist layer extends above the next underlying layer. As such, the pattern can be transferred to the substrate or underlying layer with an etch process before breaking through to the patterned photoresist layer.

Figure 2A:
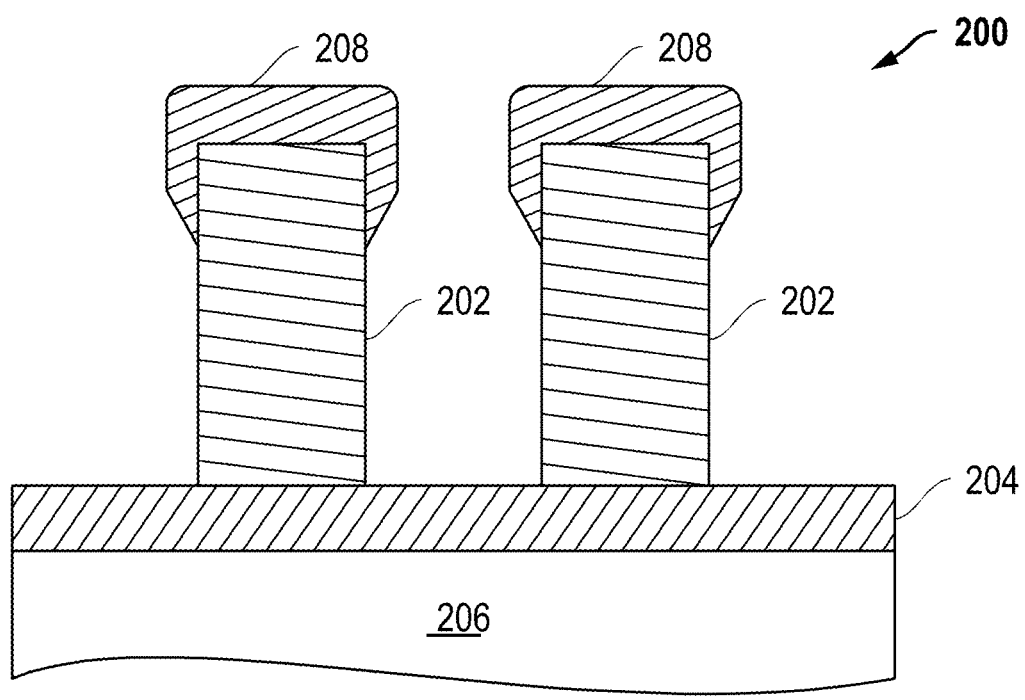
FIG. 2A is a cross-section diagram of an example embodiment where a protective cap has been selectively deposited over a patterned photoresist layer.

FIG. 2A is a cross-section diagram of an example embodiment 200 where protective caps 208 have been deposited over a patterned photoresist layer 202. For one embodiment, selective ALD is used to form the protective caps 208. The patterned photoresist layer 202 has been formed over an underlying layer 204. The underlying layer 204 is formed over a substrate 206 for a microelectronic workpiece, and the substrate 206 can include one or more previously formed layers and structures. The underlying layer 204 represents a material layer to which the pattern from the patterned photoresist layer 202 is to be transferred. For example, the underlying layer 204 can be an oxide ($SiO_2$) layer, a nitride ($SiN_3$) layer, a hard mask layer, and/or other material layer to which the pattern is to be transferred. The patterned photoresist layer 202 can be, for example, an EUV photoresist material, such as ArF photoresist material, and/or another photolithographic material. For the embodiment 200, the selective ALD has formed the protective caps 208 on the top regions and partially on the sidewalls of the patterned photoresist layer 202 above underlying layer 204 to which the pattern is to be transferred.

It is again noted that the top regions for the patterned photoresist layer 202 represent the top five to thirty percent of the height that the patterned photoresist layer 202 extends above the underlying layer 204. It is further noted that the patterned photoresist layer 202 can be made from an EUV photoresist material and can be patterned by depositing an EUV material, exposing a first portion of the EUV material to EUV radiation, and removing a second portion of the EUV material not exposed to the EUV radiation to form the patterned photoresist layer 202. It is further noted that EUV radiation is electromagnetic radiation having wavelengths of 200 nm or less and preferable 20 nm or less.

Figure 1B:
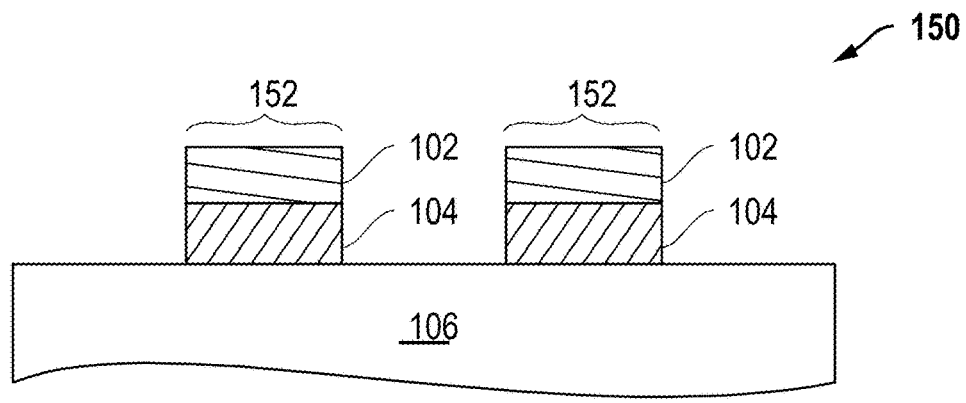
FIG. 1B (Prior Art) is a cross-section diagram of an example embodiment after an etch process has been performed to transfer the pattern from the patterned photoresist layer to the underlying layer and erosion damage has occurred.
Figure 2B:
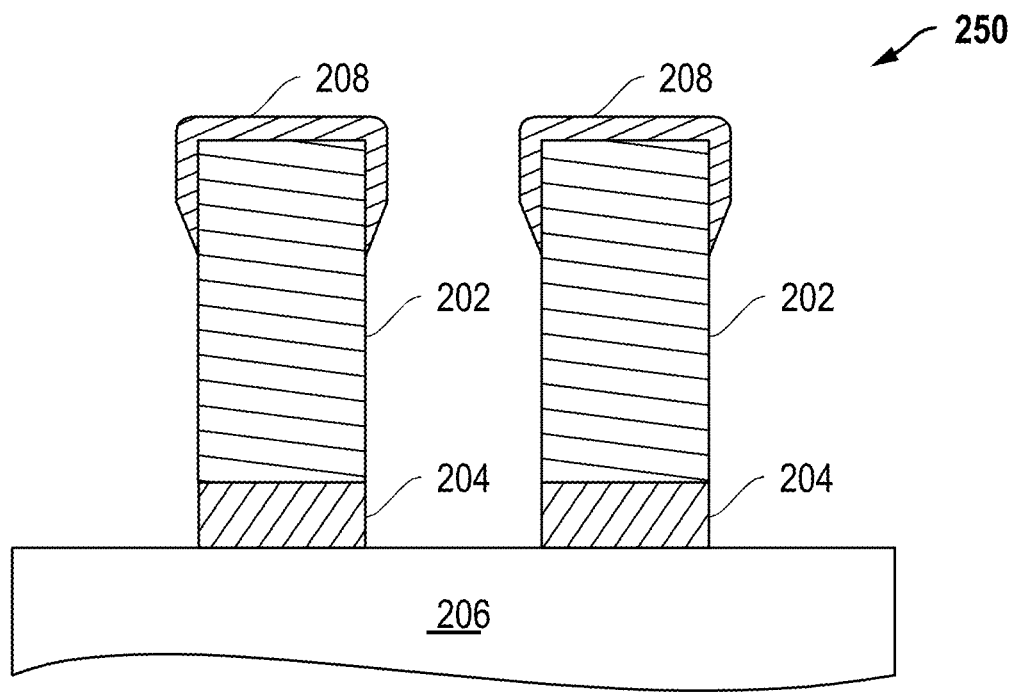
FIG. 2B is a cross-section diagram of an example embodiment after an etch process has been performed to transfer the pattern from the patterned photoresist layer to the underlying layer and erosion has been reduced or eliminated by the protective caps.

FIG. 2B is a cross-section diagram of an example embodiment 250 after an etch process has been performed to transfer the pattern from the patterned photoresist layer 202 to the underlying layer 204 and erosion has been reduced or eliminated. During this pattern transfer process, the protective caps 208 are etched; however, they protect the patterned photoresist layer 202. As such, the patterned photoresist layer 202 does not suffer the erosion experienced in prior solutions as shown in FIG. 1B (Prior Art), and the protective caps 208 allow a target level of erosion to be achieved for the patterned photoresist layer during the pattern transfer. For example, no erosion of the patterned photoresist layer 202 is experienced for some pattern transfers, and an erosion of 2 percent or less of the height of the patterned photoresist layer 202 above the underlying layer 204 is achieved for some pattern transfers. The protective caps 208 therefore allow EUV photolithographic material to be used while still allowing patterns to be transferred to underlying layers without creating defects in the intended semiconductor patterns due to erosion of the EUV photoresist pattern. Further, because a benefit is obtained with any etch-reduction of patterned photoresist, disclosed embodiments are particularly advantageous for a wide range of processes.

Figure 3:
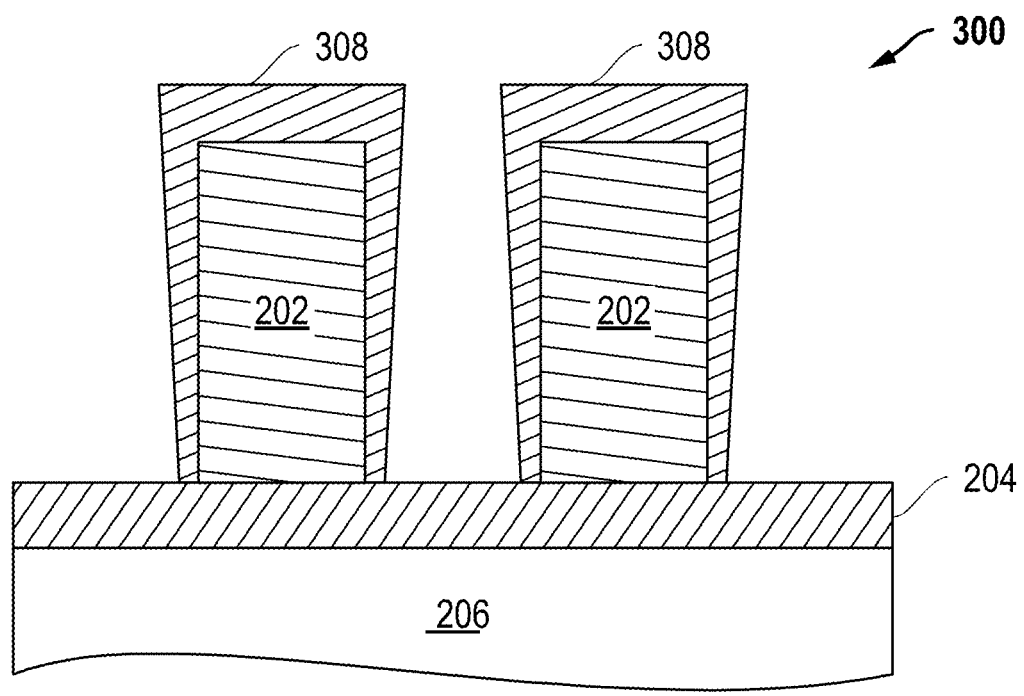
FIG. 3 is a cross-section diagram of an example embodiment where protective caps have been selectively deposited over a patterned photoresist layer to form protective caps and sidewalls are also covered.

FIG. 3 is a cross-section diagram of an example embodiment 300 where protective caps 308 have been deposited over a patterned photoresist layer 202 and sidewalls have also been covered. For one embodiment, selective ALD is used to form the protective caps 308. Embodiment 300 is similar to embodiment 200 of FIG. 2A except that the selective ALD has formed the protective caps 308 on the top regions and fully along the sidewalls of the patterned photoresist layer 202 above underlying layer 204 to which the pattern is to be transferred. Preferably, the protective material is 20 to 40 percent thicker at the top regions of patterned photoresist layers 202 than along the remaining portions of the sidewalls. During a subsequent etch process for pattern transfer to the underlying layer 204, the protective caps 308 are etched, but they protect the patterned photoresist layer 202 achieving a similar result as shown in FIG. 2B. As such, the patterned photoresist layer 202 does not suffer the erosion experienced in prior solutions as shown in FIG. 1B (Prior Art). For example, no erosion of the patterned photoresist layer 202 is experienced for some pattern transfers, and an erosion of 2 percent or less of the height of the patterned photoresist layer 202 above the underlying layer 204 is achieved for some pattern transfers.

Figure 4:
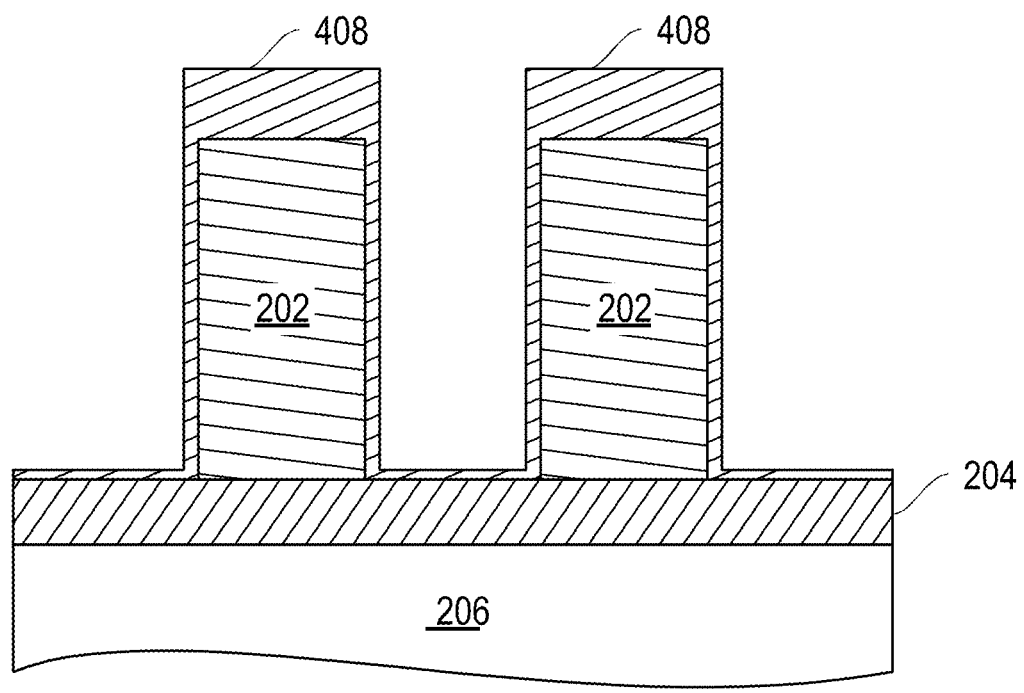
FIG. 4 is a cross-section diagram of an example embodiment where protective caps have been selectively deposited over a patterned photoresist layer to form protect caps and sidewalls as well as exposed underlying layers are also covered.

FIG. 4 is a cross-section diagram of an example embodiment 400 where protective caps 408 have been deposited over a patterned photoresist layer 202 and exposed regions of underlying layer 204 have also been covered. For one embodiment, selective ALD is used to form the protective caps 408. Embodiment 400 is similar to embodiment 200 of FIG. 2A except that the selective ALD has formed the protective caps 408 on the top regions, along the sidewalls of the patterned photoresist layer 202, and on top of exposed regions for the underlying layer 204 to which the pattern is to be transferred. Preferably, the protective material deposited is 20 to 40 percent thicker at the top regions of patterned photoresist layers 202 than along the remaining portions of the sidewalls or over the exposed regions of the underlying layer 204. During a subsequent etch process for pattern transfer to the underlying layer 204, the protective caps 408 are etched, but they protect the patterned photoresist layer 202 achieving a similar result as shown in FIG. 2B. As such, the patterned photoresist layer 202 does not suffer the erosion experienced in prior solutions as shown in FIG. 1B (Prior Art). For example, no erosion of the patterned photoresist layer 202 is experienced for some pattern transfers, and an erosion of 2 percent or less of the height of the patterned photoresist layer 202 above the underlying layer 204 is achieved for some pattern transfers.

Figure 5:
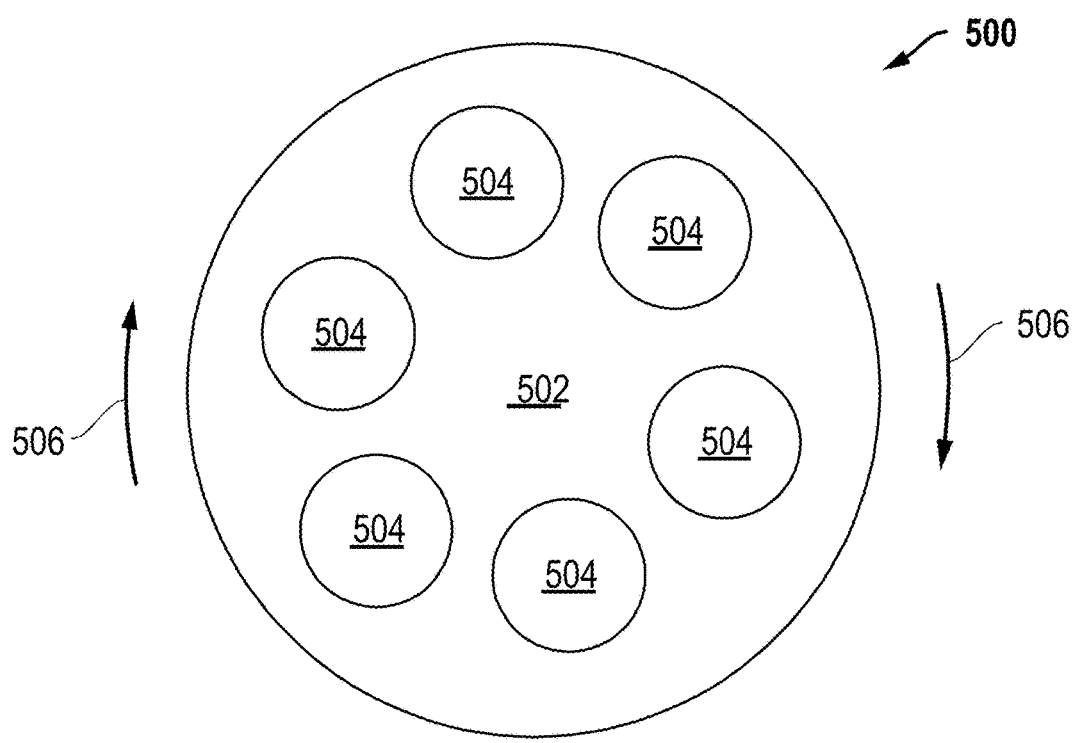
FIG. 5 is a top view of an example embodiment of a susceptor for an ALD processing tool that rotates microelectronic workpieces through multiple processing regions.

FIG. 5 is a top view of an example embodiment 500 for a susceptor 502 for an ALD processing tool. The susceptor 502 holds microelectronic workpieces 504 being processed, such as semiconductor wafers. The susceptor 502 also rotates the microelectronic workpieces 504 through multiple processing regions within the ALD processing tool as represented by arrows 506. This spatial ALD processing tool, for example, can transfer the microelectronic workpieces 504 through a sequence of processing regions to complete a layer of deposition including a precursor adsorption region, followed by a separation region of nitrogen ($N_2$) flow, followed by an oxidation and plasma treatment region. These regions can also be followed by a final separation region of N₂ flow for the deposition of each layer. This sequence of processing through different ALD processing regions can be repeated until a selected number of layers have been deposited.

For the embodiments described herein, the rotation of the susceptor 502 is performed at a relative high rate of 200 rotations-per-minute (rpm) or greater. More generally, the rotation is provided at a rate sufficient to selectively deposit the protective material preferentially on the top regions of the patterned EUV photoresist layer in order to form protective caps. In addition for some embodiments, the precursor exposure region and the oxidation exposure region have dedicated exhaust systems designed to prevent precursor and oxidation mixing even at high wafer rotation rates. Other variations could also be implemented.

Figure 6:
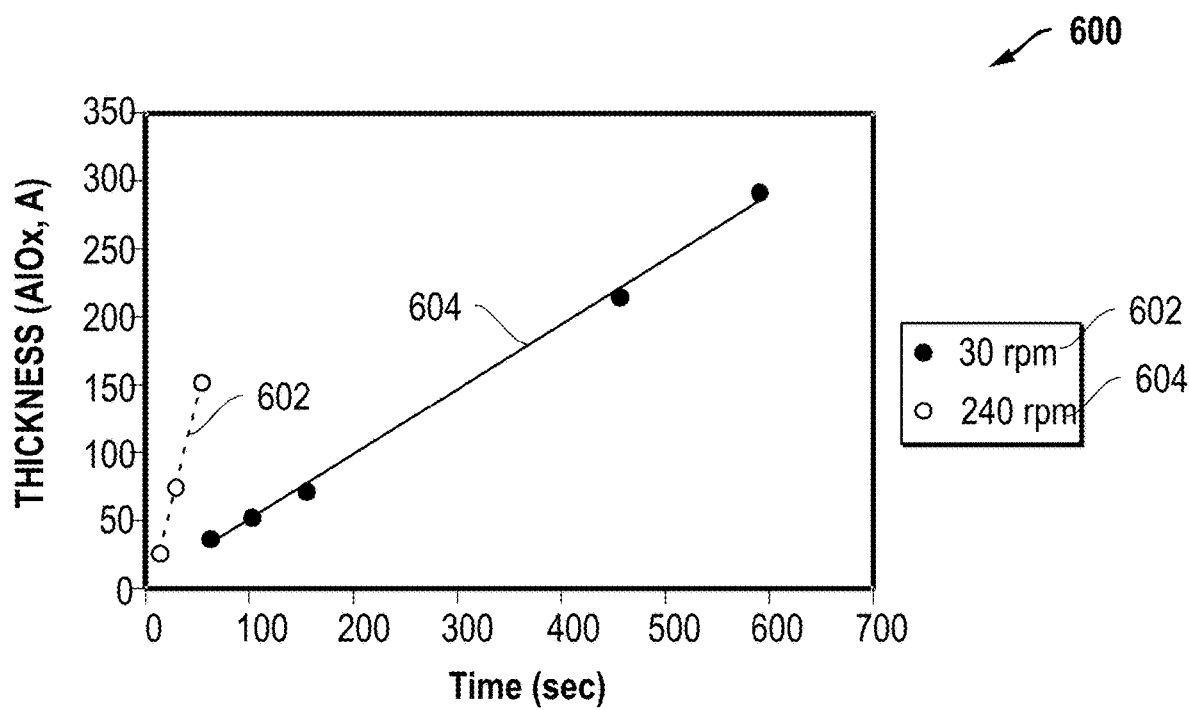
FIG. 6 is a comparison diagram of a representative embodiment for deposition thickness of an aluminum oxide versus time for the ALD process tool of FIG. 5.

FIG. 6 is a comparison diagram of a representative embodiment 600 for deposition thickness of an aluminum oxide (e.g., AlOx) versus time for the ALD process tool of FIG. 5 where the susceptor 502 is rotated at 30 rpm and at 240 rpm. The vertical axis is thickness of the layer in Angstroms (A), and the horizontal access is time in seconds. For traditional solutions, aluminum oxide deposition recipes rotate microelectronic workpieces 504 (e.g., semiconductor wafers) at 30 rpm through the ALD processing regions. Line 604 represents the results of representative data collected for this relatively slow deposition rate of 30 rpm for the conformal AlOx deposition in patterned topography. Line 602 represents the results of representative data collected for the relatively fast deposition rate of 240 rpm for the deposition of AlOx. As shown, the thickness of AlOx deposited increases at much higher rate when the microelectronic workpieces 504 are processed through the spatial ALD processing tool at a much higher rate, such as 200 rpm or greater. Further, it has been found that these increased rotation rates also correspond to preferential deposition at the top of patterned features. For example, for patterned photoresist layers, it has been found that deposited layers are 20 to 40 percent thicker at the top regions of patterned photoresist layers where the rotation rate for the ALD processing tool is 200 rpm or greater. For one embodiment, the protective material is deposited with a thickness of 1 to 10 nanometers (nm). It is again noted that the top regions for the patterned photoresist layer represents the top five to thirty percent of the height that the patterned photoresist layer extends above an immediate underlying layer. It is further noted that while aluminum oxide is provided as the example material, other protective materials can also be deposited using these high-speed rotation techniques such as silicon oxide (SiO₂), titanium oxide (TiO₂), and/or other selected protective cap material. In addition, precursors with higher sticking coefficients will tend to allow for increased preferential top deposition on patterns.

Figure 7:
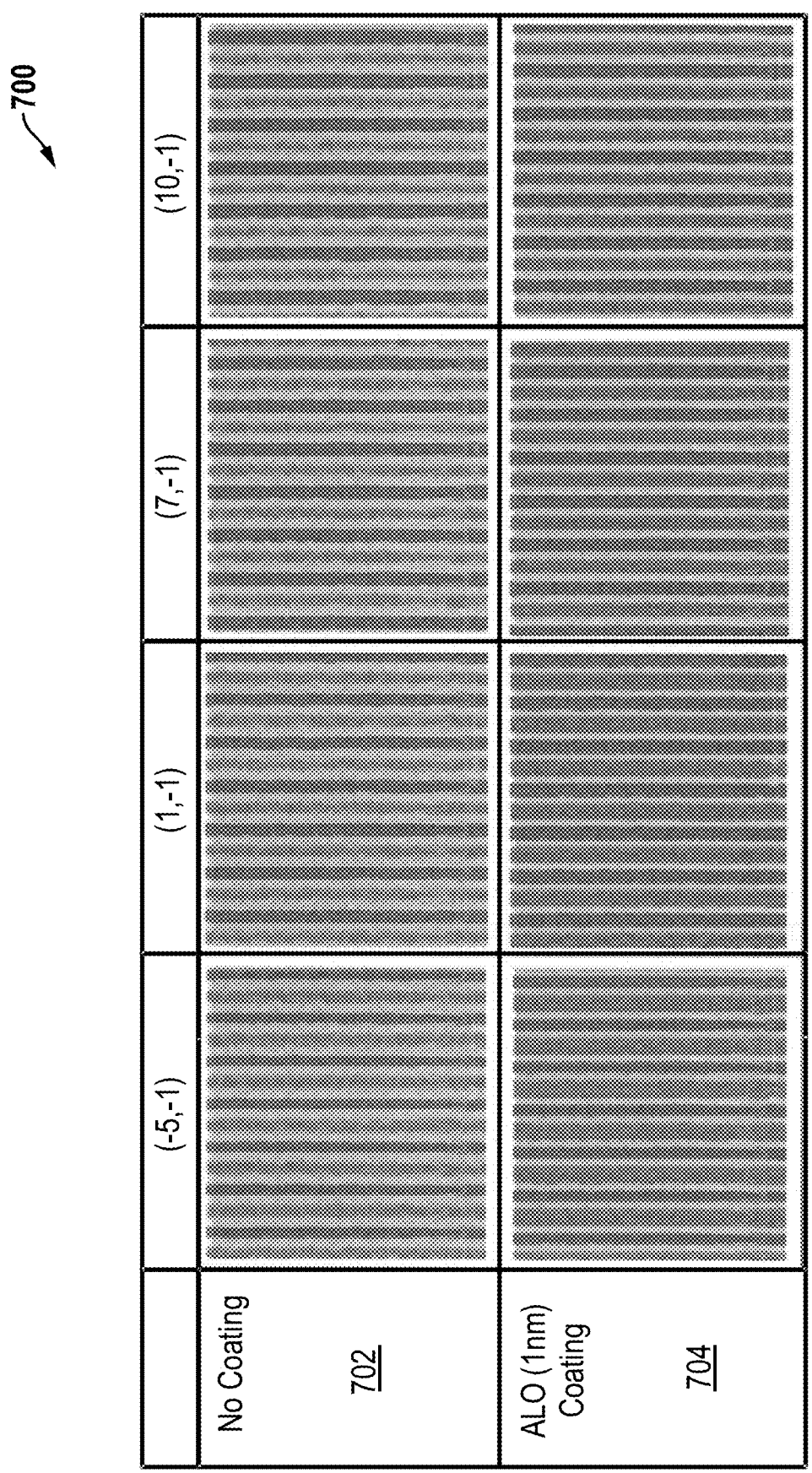
FIG. 7 is a diagram of a comparative example for etch transfer results where no coating is used and where a protective aluminum oxide coating is used as a protective cap for patterned EUV photoresist layer according to the embodiments described herein.

FIG. 7 is a diagram of a representative embodiment 700 for example etch transfer results where no coating is used and where a protective aluminum oxide (ALO) coating is used as protective caps for patterned EUV photoresist layer according to the embodiments described herein. Typical erosion by etch for a patterned EUV photoresist layer is demonstrated in the top row 702 of top-view pictures where no coating is used ("no coating"). The lighter grey regions of the patterned lines represent sidewall tapering of the patterned lines for these "no coating" transfer processes. The advantages of the disclosed embodiments are shown in the bottom row 704 of top-view pictures where a protective coating is used ("ALO (1 nm) coating"). While the same patterned EUV photoresist layer was used as with the "no coating" pattern transfers, these "coating" pattern transfers were preceded by selective deposition of a thin AlOx protective cap (e.g., 1-3 nm) that was created using the high rate (e.g., 240 rpm) ALD deposition process described herein. The top-view pictures in the bottom row 704 show that pattern integrity is maintained through the etch, unlike the "'no coating'" examples, as visualized through the narrower, more distinct grey sides of the pattern lines in the bottom row 704. It is again noted that while aluminum oxide is provided as the example material, other protective materials provide similar advantages such as silicon oxide (SiO₂), titanium oxide (TiO₂), and/or other selected protective cap material.

The selectivity of the deposition of the protective material (e.g., AlOx) to the top of the pattern from deposition can also be enhanced using various techniques. For example, reducing the TMA (trimethyl aluminum) supply in the precursor region for the spatial ALD processing tool helps to deplete the AlOx deposition as it reaches the pattern from the top of the features and thereby provides for selective ALOx deposition to the top to the pattern. For example, TMA supply reduction can be achieved by combining two methods: (1) pulsing the TMA during the high rate (e.g., 240 rpm, 200 rpm or greater) deposition process and (2) increasing the N₂ co-flow through the TMA injector, which effectively reduces the vacuum pressure seen by the TMA in the source ampoule.

Figure 8:
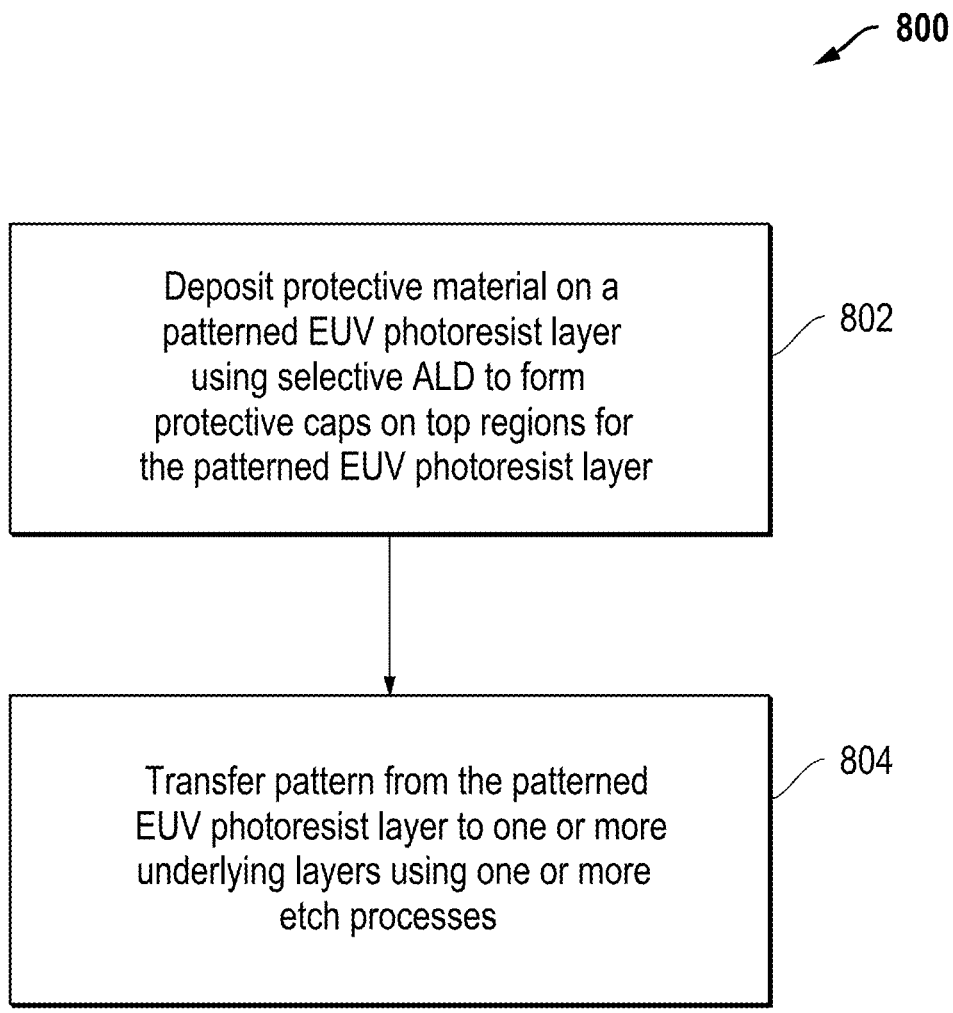
FIG. 8 is a process flow diagram of an example embodiment where selective ALD is used to deposit a protective material over patterned EUV photoresist layer to form protective caps to reduce or eliminate erosion during pattern transfer.

FIG. 8 is a process flow diagram of an example embodiment 800 where selective ALD is used to deposit a protective material over patterned EUV photoresist layer to form protective caps to reduce or eliminate erosion during pattern transfer. For block 802, a protective material is deposited on a patterned extreme ultraviolet (EUV) photoresist layer using selective atomic layer deposition (ALD) to form protective caps on top regions for the patterned EUV photoresist layer. In block 804, a pattern is transferred from the patterned EUV photoresist layer to one or more underlying layers using one or more etch processes. Additional and/or different process steps could also be used while still taking advantage of the process techniques described herein.

It is noted that one or more deposition processes can be used to form the material layers described herein. For example, one or more depositions can be implemented using chemical vapor deposition (CVD), plasma enhanced CVD (PECVD), physical vapor deposition (PVD), atomic layer deposition (ALD), and/or other deposition processes. For a plasma deposition process, a precursor gas mixture can be used including but not limited to hydrocarbons, fluorocarbons, or nitrogen containing hydrocarbons in combination with one or more dilution gases (e.g., argon, nitrogen, etc.) at a variety of pressure, power, flow and temperature conditions. Lithography processes with respect to PR layers can be implemented using optical lithography, extreme ultraviolet (EUV) lithography, and/or other lithography processes. The etch processes can be implemented using plasma etch processes, discharge etch processes, and/or other desired etch processes. For example, plasma etch processes can be implemented using plasma containing fluorocarbons, oxygen, nitrogen, hydrogen, argon, and/or other gases. In addition, operating variables for process steps can be controlled to ensure that CD target parameters for vias are achieved during via formation. The operating variables may include, for example, the chamber temperature, chamber pressure, flowrates of gases, frequency and/or power applied to electrode assembly in the generation of plasma, and/or other operating variables for the processing steps. Variations can also be implemented while still taking advantage of the techniques described herein.

It is noted that reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

"Microelectronic workpiece" as used herein generically refers to the object being processed in accordance with the invention. The microelectronic workpiece may include any material portion or structure of a device, particularly a semiconductor or other electronics device, and may, for example, be a base substrate structure, such as a semiconductor substrate or a layer on or overlying a base substrate structure such as a thin film. Thus, workpiece is not intended to be limited to any particular base structure, underlying layer or overlying layer, patterned or unpatterned, but rather, is contemplated to include any such layer or base structure, and any combination of layers and/or base structures. The description below may reference particular types of substrates, but this is for illustrative purposes only and not limitation.

The term "substrate" as used herein means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

Systems and methods for processing a microelectronic workpiece are described in various embodiments. One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Further modifications and alternative embodiments of the described systems and methods will be apparent to those skilled in the art in view of this description. It will be recognized, therefore, that the described systems and methods are not limited by these example arrangements. It is to be understood that the forms of the systems and methods herein shown and described are to be taken as example embodiments. Various changes may be made in the implementations. Thus, although the inventions are described herein with reference to specific embodiments, various modifications and changes can be made without departing from the scope of the present inventions. Accordingly, the specification and figures are to be regarded in an illustrative rather than a restrictive sense, and such modifications are intended to be included within the scope of the present inventions. Further, any benefits, advantages, or solutions to problems that are described herein with regard to specific embodiments are not intended to be construed as a critical, required, or essential feature or element of any or all the claims.

What is claimed is:

1. A method of processing microelectronic workpieces, comprising:
   providing a patterned extreme ultraviolet (EUV) photoresist layer above an underlying layer, the patterned EUV photoresist layer including openings having sidewalls, with the openings forming a pattern for the EUV photoresist layer;
   depositing a protective material on the patterned EUV photoresist layer using selective atomic layer deposition (ALD) to form protective caps on top regions for the patterned EUV photoresist layer, the protective material comprising aluminum oxide, silicon oxide or titanium oxide; and
   transferring the pattern for the patterned EUV photoresist layer to the underlying layer using one or more etch processes.

2. The method of claim 1, further comprising forming an EUV photoresist layer over the underlying layer and patterning the EUV photoresist layer to form the patterned EUV photoresist layer;
   the patterning comprising depositing an EUV material, exposing a first portion of the EUV material to EUV radiation of 20 nm or less, and removing a second portion of the EUV material not exposed to the EUV radiation to form the patterned EUV photoresist layer.

3. The method of claim 1, further comprising removing the protective caps and the patterned EUV photoresist layer after transferring the pattern to the underlying layer.

4. The method of claim 1, wherein the patterned photoresist layer comprises an argon fluoride (ArF) photoresist.

5. The method of claim 1, wherein the underlying layer includes exposed regions exposed through the openings of the patterned EUV photoresist layer prior to depositing the protective material, and the depositing forms the protective caps without covering the exposed regions of the underlying layer.

6. The method of claim 1, wherein the depositing comprises positioning the microelectronic workpiece in an ALD processing tool and rotating the microelectronic workpiece at a speed of at least 200 rpm through a plurality of processing regions within the ALD processing tool to deposit the protective material.

7. The method of claim 6, wherein the depositing of the protective material forms a coating of 1 to 10 nanometers.

8. The method of claim 6, further comprising rotating the microelectronic workpiece through a precursor adsorption region, a separation region of nitrogen N2 flow, and an oxidation and plasma treatment region to complete each layer of deposition.

9. The method of claim 8, further comprising also rotating the microelectronic workpiece through a final separation region of N2 flow for each layer of deposition.

10. The method of claim 8, wherein the protective material is aluminum oxide (Al2O3) and wherein TMA (trimethyl aluminum) is used for the precursor adsorption region for the ALD processing tool.

11. The method of claim 10, wherein a supply for the TMA is reduced in the precursor adsorption region to facilitate selective deposition of the protective material to the top regions of the patterned EUV photoresist layer.

12. The method of claim 6, wherein the protective material is 20-40% thicker at the top regions of the patterned EUV photoresist layer as compared to other regions where the protective material is deposited.

13. The method of claim 12, wherein a thickness of the protective material at the top regions is up to thirty percent of the height that the patterned EUV photoresist layer extends above the underlying layer, and wherein the underlying layer is immediately below the patterned EUV photoresist layer.

14. The method of claim 13, wherein the thickness of the protective material at the top regions is 5 to 30% of a height of the patterned EUV photoresist material.

15. The method according to claim 1, wherein during the ALD, the microelectronic workpiece is rotated through a precursor adsorption region, a separation region of nitrogen flow, and an oxidation and pretreatment region to form each layer of deposition; and
wherein in the precursor adsorption region a supply of a precursor is reduced by at least one of pulsing a flow of the precursor or supplying nitrogen with the precursor in the precursor adsorption region.

16. The method according to claim 15, wherein the protective material comprises aluminum oxide, and the precursor includes trimethyl aluminum.

17. The method of claim 1, wherein during transferring of the pattern to the underlying layer, the protective layer is etched and an amount of erosion of the patterned EUV photoresist is 2 percent or less of a height of the patterned EUV photoresist layer.

18. A method of processing microelectronic workpieces comprising:
providing a patterned extreme ultraviolet (EUV) photoresist layer above an underlying layer, the patterned EUV photoresist layer including openings having sidewalls, with the openings forming a pattern for the EUV photoresist layer,
depositing a protective material on the patterned EUV photoresist layer to form protective caps on top regions of the patterned EUV photoresist layer such that a thickness of the protective caps is 5 to 30% of a height of the openings in the patterned EUV photoresist layer, the depositing of the protective material performed using selective atomic layer (ALD) deposition performed while rotating the microelectronic workpiece through a plurality of processing regions at a speed of at least 200 rpm; and
transferring the pattern for the patterned EUV photoresist layer to the underlying layer using one or more etch processes.

19. The method according to claim 18, wherein during the ALD, the microelectronic workpiece is rotated through a precursor adsorption region, a separation region of nitrogen flow, and an oxidation and pretreatment region to form each layer of deposition; and
wherein in the precursor adsorption region a supply of a precursor is reduced by at least one of pulsing a flow of the precursor or supplying nitrogen with the precursor in the precursor adsorption region.

20. The method of claim 19, wherein the protective material comprises aluminum oxide, silicon oxide, or titanium oxide.

21. The method of claim 20, wherein during transferring of the pattern to the underlying layer, the protective material is etched and an amount of erosion of the patterned EUV photoresist is 2 percent or less of a height of the patterned EUV photoresist layer; and
wherein the patterned EUV photoresist layer is formed by exposing an EUV material to EUV radiation of 20 nm or less.

* * * * *